United States Patent [19]

Nakamura et al.

[11] Patent Number: 5,494,891

[45] Date of Patent: Feb. 27, 1996

[54] METHOD FOR MANUFACTURING THREE-TERMINAL OXIDE SUPERCONDUCTING DEVICES

[75] Inventors: Takao Nakamura; Michitomo Iiyama, both of Osaka, Japan

[73] Assignee: Sumitomo Electric Industries, Ltd., Osaka, Japan

[21] Appl. No.: 354,048

[22] Filed: Dec. 6, 1994

Related U.S. Application Data

[62] Division of Ser. No. 983,133, Nov. 30, 1992, Pat. No. 5,399,546.

[30] Foreign Application Priority Data

| Nov. 30, 1991 | [JP] | Japan | 3-342467 |
| Nov. 30, 1991 | [JP] | Japan | 3-342468 |
| Nov. 30, 1991 | [JP] | Japan | 3-342469 |
| Nov. 30, 1991 | [JP] | Japan | 3-342470 |

[51] Int. Cl.$^6$ .......................... H01L 39/24; H01B 12/00
[52] U.S. Cl. ...................... 505/330; 505/473; 505/410; 505/191; 505/193; 505/701; 505/728; 427/62; 427/63; 257/35; 257/39
[58] Field of Search .................. 505/330, 193, 505/191, 728, 410, 473, 729, 701; 427/62, 63; 257/35, 39

[56] References Cited

U.S. PATENT DOCUMENTS

| 5,087,605 | 2/1992 | Hegde et al. | 257/661 |
| 5,236,896 | 8/1993 | Nakamura et al. | 505/729 |
| 5,322,526 | 6/1994 | Nakamura et al. | 505/703 |
| 5,345,115 | 9/1994 | Tokuda et al. | 505/193 |

FOREIGN PATENT DOCUMENTS

| 280308 | 8/1988 | European Pat. Off. . |
| 324044 | 7/1989 | European Pat. Off. . |
| 478465 | 4/1992 | European Pat. Off. . |
| 505259 | 9/1992 | European Pat. Off. . |

OTHER PUBLICATIONS

Mannhart, J. et al, "Electric Field Effect on Superconducting $YBa_2Cu_3O_7-\delta$", *Zeitschrift Für Physik B*, vol. 83, No. 3: pp. 307–311 (1991).

Levy, A. et al, "Field-effect Conductance of $YBa_2Cu_3O_6$", *Journal of Applied Physics*, vol. 69, No. 8: pp. 4439–4441, 15 Apr. 1991.

*Primary Examiner*—Roy V. King
*Attorney, Agent, or Firm*—Foley & Lardner

[57] ABSTRACT

A superconducting device comprises a substrate, a non-superconducting layer formed in a principal surface of said substrate, an extremely thin superconducting channel formed of an oxide superconductor thin film on the non-superconducting layer. A superconducting source region and a superconducting drain region of a relatively thick thickness are formed of the oxide superconductor at the both sides of the superconducting channel separated from each other but electrically connected through the superconducting channel, so that a superconducting current can flow through the superconducting channel between the superconducting source region and the superconducting drain region. The superconducting device further includes a gate electrode through a gate insulator on the superconducting channel for controlling the superconducting current flowing through the superconducting channel, in which the superconducting channel is connected to the superconducting source region and the superconducting drain region at the higher portions than their one third height portions.

18 Claims, 9 Drawing Sheets

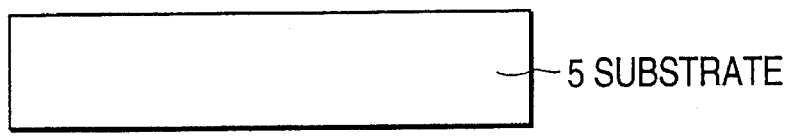
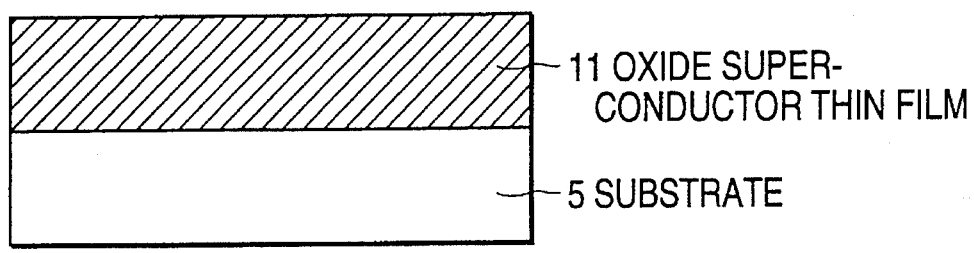
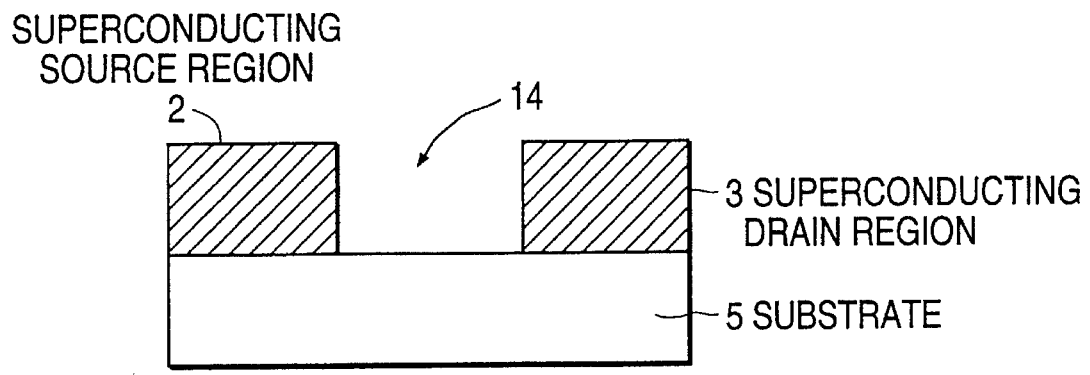
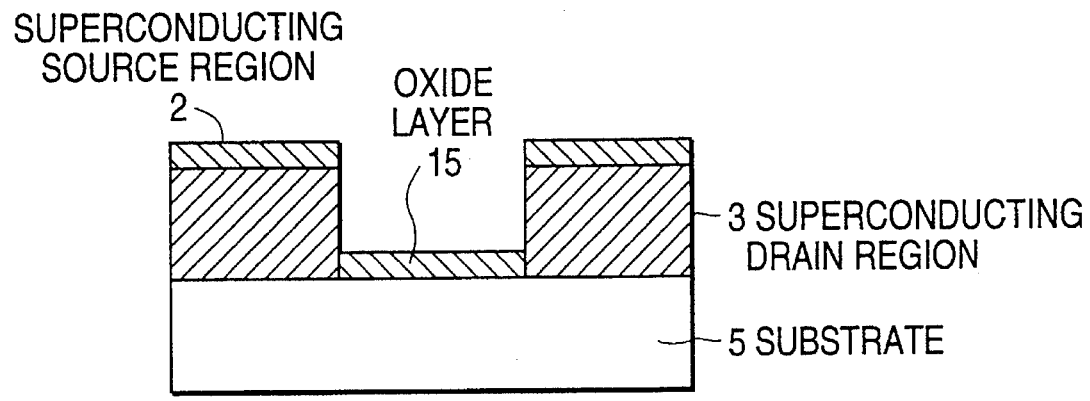

METHOD FOR MANUFACTURING THREE-TERMINAL OXIDE SUPERCONDUCTING DEVICES

This application is a division of application Ser. No. 07/983,133, filed Nov. 30, 1992 now U.S. Pat. No. 5,399,546.

BACKGROUND OF THE INVENTION

1. Field of the Invention

The present invention relates to a superconducting device and a method for manufacturing the same, and more specifically to a superconducting device having an extremely thin superconducting channel formed of oxide superconductor material, and a method for manufacturing the same.

2. Description of Related Art

Devices which utilize superconducting phenomena operate at high speed with low power consumption so that they have higher performance than conventional semiconductor devices. Particularly, by using an oxide superconducting material which has been recently advanced in study, it is possible to produce a superconducting device which operates at relatively high temperature.

Josephson device is one of well-known superconducting devices. However, since Josephson device is a two-terminal device, a logic gate utilizing Josephson devices becomes complicated. Therefore, three-terminal superconducting devices are more practical.

Typical three-terminal superconducting devices include two types of super-FET (field effect transistor). The first type of the super-FET includes a semiconductor channel, and a superconductor source electrode and a superconductor drain electrode which are formed closely to each other on both side of the semiconductor channel. A portion of the semiconductor layer between :the superconductor source electrode and the superconductor drain electrode has a greatly recessed or undercut rear surface so as to have a reduced thickness. In addition, a gate electrode is formed through a gate insulator layer on the portion of the recessed or undercut rear surface of the semiconductor layer between the superconductor source electrode and the superconductor drain electrode.

A superconducting current flows through the semiconductor layer (channel) between the superconductor source electrode and the superconductor drain electrode due to a superconducting proximity effect, and is controlled by an applied gate voltage. This type of the super-FET operates at a higher speed with a low power consumption.

The second type of the super-FET includes a substrate, a channel of a superconductor formed on the substrate, a superconducting source region and a superconducting drain region positioned at the both sides of the superconducting channel, a source electrode and a drain electrode respectively positioned on the superconducting source region and the superconducting drain region, a gate electrode on the superconducting channel, and a gate insulating layer between the superconducting channel and the gate electrode. Superconducting current flowing through the superconducting channel of the super-FET is controlled by a voltage applied to a gate formed above the superconducting channel.

Both of the super-FETs mentioned above are voltage controlled devices which are capable of isolating output signal from input one and of having a well defined gain.

However, since the first type of the super-FET utilizes the superconducting proximity effect, the superconductor source electrode and the superconductor drain electrode have to be positioned within a distance of a few times the coherence length of the superconductor materials of the superconductor source electrode and the superconductor drain electrode. In particular, since an oxide superconductor has a short coherence length, a distance between the superconductor source electrode and the superconductor drain electrode has to be made less than about a few ten nanometers, if the superconductor source electrode and the superconductor drain electrode are formed of the oxide superconductor material. However, it is very difficult to conduct a fine processing such as a fine pattern etching, so as to satisfy the very short electrode distance mentioned above.

On the other hand, the super-FET having the superconducting channel has a large current capability, and the fine processing which is required to product the first type of the super-FET is not necessary to product this type of super-FET.

In order to obtain a complete ON/OFF operation, both of the superconducting channel and the gate insulating layer should have an extremely thin thickness. For example, the superconducting channel formed of an oxide superconductor material should have a thickness of less than five nanometers, namely about four or five unit-cells and the gate insulating layer should have a thickness more than ten nanometers which is sufficient to prevent a tunnel current.

In the prior art, the extremely thin superconducting channel of the oxide superconductor has been usually formed directly on a single crystalline insulator substrate such as MgO (100) substrate. In this case, constituent elements of the substrate are diffused into the superconducting channel while the superconducting channel is formed on the substrate. Since the superconducting channel has an extremely thin thickness, the effect of the diffusant is not negligible. Therefore, properties of the superconducting channel is spoiled so that the super-FET can not have high performance.

Even if the effect is negligible, one or two unit-cells of the bottom side of the superconducting channel formed of the oxide superconductor may not behave as a superconductor. Therefore, the substantial thickness of the superconducting channel becomes thinner than the physical thickness, which in turn the superconducting current through the superconducting channel is reduced than expected.

The non-superconducting regions are considered to be generated by a bared Cu—O plane at the bottom surface of the oxide superconductor layer which constitutes the superconducting channel.

In addition, since the extremely thin superconducting channel is connected to the relatively thick superconducting source region and the superconducting drain region at their lower portions and is far from the source electrode positioned on the superconducting source region and the drain electrodes positioned on the superconducting drain region, the superconducting current flowing through the superconducting channel spreads in the superconducting source region and the superconducting drain region. Therefore, the superconducting current does not flow into nor flow from the superconducting channel, efficiently.

SUMMARY OF THE INVENTION

Accordingly, it is an object of the present invention to provide an FET type superconducting device having a superconducting channel constituted of an extremely thin oxide superconductor film, which have overcome the above mentioned defects of the conventional ones.

Another object of the present invention is to provide a method for manufacturing an FET type superconducting device which have overcome the above mentioned defects of the conventional ones.

The above and other objects of the present invention are achieved in accordance with the present invention by a superconducting device comprising a substrate, a non-superconducting layer formed on a principal surface of said substrate, an extremely thin superconducting channel formed of an oxide superconductor thin film on the non-superconducting layer, a superconducting source region and a superconducting drain region of a relatively thick thickness formed of the oxide superconductor at the both sides of the superconducting channel separated from each other but electrically connected through the superconducting channel, so that a superconducting current can flow through the superconducting channel between the superconducting source region and the superconducting drain region, and a gate electrode through a gate insulator on the superconducting channel for controlling the superconducting current flowing through the superconducting channel, in which the superconducting channel is connected to the superconducting source region and the superconducting drain region at the higher portions than their one third height portions.

Since, the superconducting channel of the superconducting device in accordance with the present invention is connected to the superconducting source region and the superconducting drain region at the higher portions than their one third height portions superconducting current does not spread in the superconducting source region and the superconducting drain region. Therefore, the superconducting current efficiently flows into or flows from the superconducting channel.

In this connection, the superconducting source region and the superconducting drain region of the superconducting device in accordance with the present invention have a thickness of 100 to 500 nanometers and the non-superconducting layer preferably has a thickness ranging one third thickness to the same thickness of the superconducting source region and the superconducting drain region.

In a preferred embodiment, the non-superconducting layer has an approximately half thickness of the superconducting source region and the superconducting drain region. In this case, the superconducting channel is preferably connected to middle portions of the superconducting source region and the superconducting drain region. It is preferable that the gate insulating layer also covers the side surfaces of the superconducting source region and the superconducting drain region so as to isolate the gate electrode from the superconducting source region and the superconducting drain region.

In one preferred embodiment, opposite side surfaces of the superconducting source region and the superconducting drain region are slanted so that a vacancy between the superconducting source region and the superconducting drain region has a shape of a trapezoid, the superconducting source region and the superconducting drain region become shorter at the lower portions and the shortest at the bottom, and the non-superconducting layer is longer than the gate insulating layer, which is longer than the gate electrode. In this case, the gate electrode does not contact with the superconducting source region and the superconducting drain region. In the abovementioned superconducting device the slant side surfaces contribute to the improvement of the efficiency of the superconducting current flow.

In another preferred embodiment, the gate electrode is formed of a material which includes silicon, for example, polycrystalline silicon. In this superconducting device, the gate electrode is isolated from the superconducting source region and the superconducting drain region by insulation regions which are formed by silicon diffused from the gate electrode into the superconducting source region and the superconducting drain region. It is preferable that the superconducting device further includes a metal layer on the gate insulating layer which prevent silicon from diffusing into the superconducting channel.

In another preferred embodiment, the non-superconducting layer has almost the same thickness as those of the superconducting source region and the superconducting drain region. In this case, the superconducting channel is preferably connected to top portions of the superconducting source region and the superconducting drain region. The superconducting channel of this superconducting device is constituted of an extremely thin oxide superconductor film which is deposited on the planar surfaces of the non-superconducting layer, the superconducting source region and the superconducting drain region. Therefore, the oxide superconductor thin film is free from stress so that the properties of the superconducting channel is improved.

The non-superconducting layer can be formed of an insulator material which does not react with the oxide superconductor and does not diffuse into the oxide superconductor thin film, such as MgO, $SrTiO_3$, etc. Particularly, the non-superconducting layer is preferably formed of an oxide of which the crystal structure is similar to that of the oxide superconductor such as $Pr_1Ba_2Cu_3O_{7-\epsilon}$.

$Pr_1Ba_2Cu_3O_{7-\epsilon}$ compensate for crystalline incompleteness of an oxide superconductor thin film so that properties of the oxide superconductor thin film is improved. Especially, when the superconducting channel is formed of a c-axis orientated oxide superconductor thin film, the oxide layer formed of a c-axis orientated $Pr_1Ba_2Cu_3O_{7-\epsilon}$ thin film is favorable. Since the c-axis orientated $Pr_1Ba_2Cu_3O_{7-\epsilon}$ thin film has an almost same crystal lattice structure as that of a c-axis orientated oxide superconductor thin film.

Namely, cross-sectional area of the superconducting channel of the superconducting device in accordance with the present invention is the same size as desired and substantially larger than that of a conventional superconducting device. With this, the superconducting device in accordance with the present invention has a larger current capability than a conventional one.

In a preferred embodiment, the oxide superconductor is formed of high-$T_c$ (high critical temperature) oxide superconductor, particularly, formed of a high-$T_c$ copper-oxide type compound oxide superconductor for example a Y—Ba—Cu—O compound oxide superconductor material, a Bi—Sr—Ca—Cu—O compound oxide superconductor material, and a Tl—Ba—Ca—Cu—O compound oxide superconductor material.

The gate insulating layer can be formed of an insulator material, preferably formed of $SrTiO_3$, MgO, SiN, etc.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film having a high degree of crystalline orientation.

Preferably, the superconducting channel is formed of a c-axis orientated oxide superconductor thin film.

According to another aspect of the present invention, there is provided a method for manufacturing a superconducting device, comprising the steps of forming on a principal surface of a substrate a first oxide superconductor thin film having a relatively thick thickness, selectively etching a center portion of the first oxide superconductor thin film so that the portion of the first oxide superconductor thin film is completely removed and a surface of the substrate is exposed so as to form a superconducting source region and a superconducting drain region separately on the substrate, forming a non-superconductor layer having a thickness ranging from one third thickness to the same thickness of the superconducting source region and the superconducting drain region on the exposed surface of the substrate, forming a second extremely thin oxide superconductor thin film on the non-superconducting layer so that an extremely thin superconducting channel which is connected to the superconducting source region and the superconducting drain region at the higher portions than their one third height portions is formed on the non-superconducting layer, and forming a gate insulating layer and a gate electrode stacked on the gate insulating layer on a portion of the second oxide superconductor thin film above the non-superconducting layer.

In a preferred embodiment, the non-superconducting layer is formed so as to have an approximately half thickness of the first oxide superconductor thin film. In this case, the non-superconducting layer, the superconducting channel, the gate insulating layer and the gate electrode are formed on the exposed surface of the substrate between the superconducting source region and the superconducting drain region. In other words, they are formed at the hollow portion between the superconducting source region and the superconducting drain region. Therefore, the superconducting channel, the gate insulating layer and the gate electrode can be self-aligned. The gate insulating layer is preferably formed so as to cover the side surfaces of the superconducting source region and the superconducting drain region.

In one preferred embodiment, first oxide superconductor thin film is preferably etched by an isotropic etching process so as to form a vacancy having a shape of a trapezoid between the superconducting source region and the superconducting drain region, the superconducting source region and the superconducting drain region become shorter at the lower portions and the shortest at the bottom.

In another preferred embodiment, the non-superconducting layer is formed so as to have almost the same thickness as those of the superconducting source region and the superconducting drain region.

It is preferable that the method in accordance with the present invention further includes a step of heating the substrate to a temperature of 350° to 400° C. under a pressure lower than $1 \times 10^{-9}$ Torr after etching the first oxide superconductor thin film in order to clean the exposed surface of the substrate.

The above and other objects, features and advantages of the present invention will be apparent from the following description of preferred embodiments of the invention with reference to the accompanying drawings.

BRIEF DESCRIPTION OF THE DRAWINGS

FIGS. 1A to 1G are diagrammatic sectional views for illustrating a first embodiment of the process in accordance with the present invention for manufacturing the super-FET;

DESCRIPTION OF THE PREFERRED EMBODIMENTS

Embodiment 1

Figure 1E:
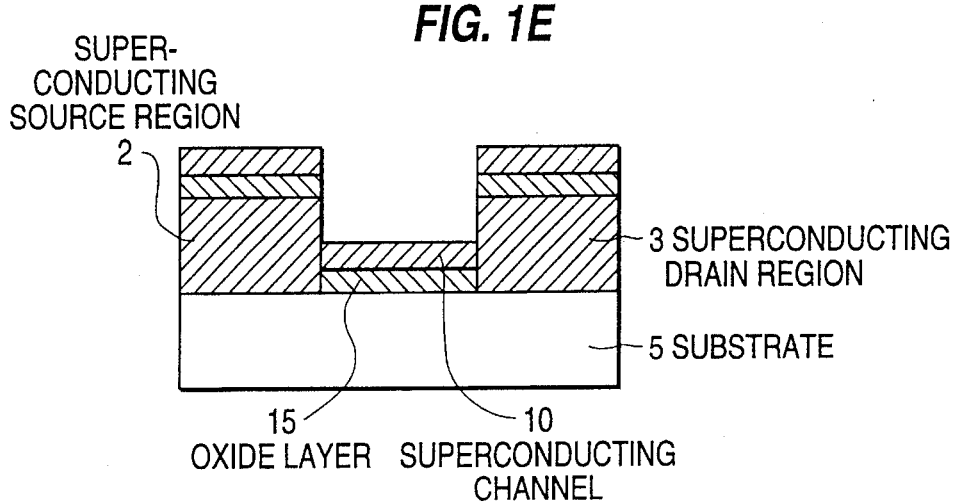

Referring to FIGS. 1A to 1G, the process in accordance with the present invention for manufacturing the super-FET will be described.

As shown in FIG. 1A, a MgO (100) single crystalline substrate 5 having a substantially planar principal surface ((100) surface) is prepared. As shown in FIG. 1B, a c-axis orientated $Y_1Ba_2Cu_3O_{7-\delta}$ oxide superconductor thin film 11 having a thickness of about 250 nanometers is deposited on a principal surface of a MgO substrate 5, by for example a sputtering, an MBE (molecular beam epitaxy), a vacuum evaporation, a CVD, etc. A condition of forming the c-axis orientated $Y_1Ba_2Cu_3O_{7-\delta}$ oxide superconductor thin film 11 by off-axis sputtering is as follows:

| | |
|---|---|
| Temperature of the substrate | 700° C. |
| Sputtering Gas | Ar: 90% |
| | $O_2$: 10% |
| Pressure | $5 \times 10^{-2}$ Torr |

Then a center portion of the $Y_1Ba_2Cu_3O_{7-\delta}$ oxide superconductor thin film 11 is selectively etched by a reactive ion etching process using a chloric gas, an ion milling using Ar-ions or a focused ion beam etching, so that the oxide superconductor of the portion 14 is completely removed and a superconducting source region 2 and a superconducting drain region 3 are formed separately on the substrate 5, as shown in FIG. 1C. A surface of the substrate 5 is exposed at the portion 14.

Thereafter, the substrate 5 is heated to a temperature of 350° to 400° C. under a pressure lower than $1 \times 10^{-9}$ torr so as to clean the exposed portion 14 of the substrate 5. As shown in FIG. 1D, an oxide layer 15 having a thickness of 150 nanometers composed of c-axis orientated $Pr_1Ba_2Cu_3O_{7-\epsilon}$ is deposited on the exposed surface 14 of the substrate 5, by an MBE. The oxide layer 15 preferably has a thickness ranging from one third to the same thickness of the superconducting source region 2 and the superconducting drain region 3. While the $Pr_1Ba_2Cu_3O_{7-\epsilon}$ thin film 15 is growing, the surface morphology of the $Pr_1Ba_2Cu_3O_{7-\epsilon}$ thin film 15 is monitored by RHEED. A condition of forming the c-axis orientated $Pr_1Ba_2Cu_3O_{7-\epsilon}$ oxide thin film 15 by MBE is as follows:

| | |
|---|---|
| Molecular beam source | Pr: 1225° C. |
| | Ba: 600° C. |

-continued

| Pressure | Cu: 1040° C. |
| Temperature of the substrate | 1 × 10⁻⁵ Torr |
|  | 700° C. |

Then, the Pr molecular beam source is exchanged to a Y molecular beam source so that a superconducting channel 10 of a c-axis orientated $Y_1Ba_2Cu_3O_{7-\delta}$ oxide superconductor thin film having a thickness of about 5 nanometer is continuously formed on the oxide layer 15 of $Pr_1Ba_2Cu_3O_{7-\epsilon}$ thin film, as shown in FIG. 1E. The $Pr_1Ba_2Cu_3O_{7-\epsilon}$ oxide thin film and $Y_1Ba_2Cu_3O_{7-\delta}$ oxide superconductor thin film deposited on the superconducting source region 2 and the superconducting drain region 3 can be removed, if necessary.

Figure 1F:
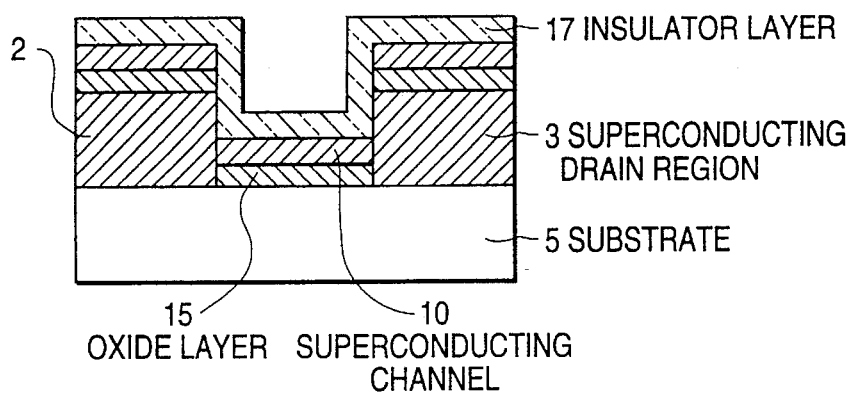

Thereafter, as shown in FIG. 1F, an insulator layer 17 of MgO is formed by a sputtering successively on the superconducting source region 2, the superconducting channel 10 and the superconducting drain region 3. The insulating layer 17 has a thickness of 10 to 20 nanometers and covers side surfaces of the superconducting source region 2 and the superconducting drain region 3 for their insulation.

Figure 1G:
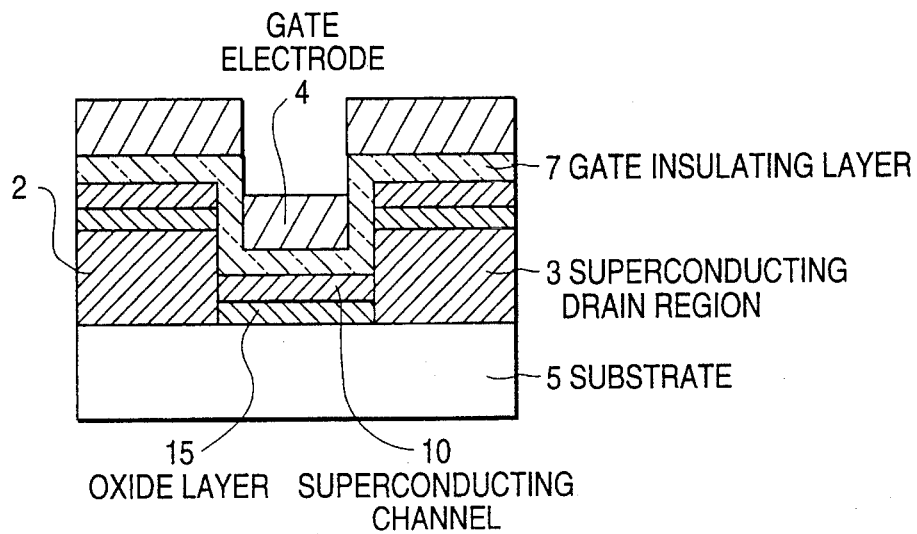

Finally, as shown in FIG. 1G, a gate electrode 4 of Au is formed on a center portion of the insulator layer 17 by a vacuum evaporation. The center portion of the insulator layer 17 under the gate electrode 4 becomes a gate insulating layer 7. A metal source electrode and a metal drain electrode may be formed on the superconducting source region 2 and the superconducting drain region 3 respectively, if necessary. With this, the super-FET in accordance with the present invention is completed.

The above mentioned super-FET manufactured in accordance with the first embodiment of the method of the present invention has a superconducting channel which is formed on the $Pr_1Ba_2Cu_3O_{7-\epsilon}$ non-superconducting oxide layer of which the crystal structure is similar to that of the $Y_1Ba_2Cu_3O_{7-\delta}$ oxide superconductor. Therefore, the bottom portion of the superconducting channel is not degraded so that the substantial cross-sectional area of the superconducting channel of the super-FET is larger than that of a conventional super-FET.

Additionally, since the superconducting channel is connected to the superconducting source region and the superconducting drain region at their middle portions, superconducting current efficiently flows into and flows from the superconducting channel. By all of these, the current capability of the super-FET can be improved.

Furthermore, the oxide layer, the superconducting channel, the gate insulating layer and the gate electrode are self-aligned. Therefore, the limitation in the fine processing technique required for manufacturing the super-FET is relaxed.

Embodiment 2

Figure 2A:
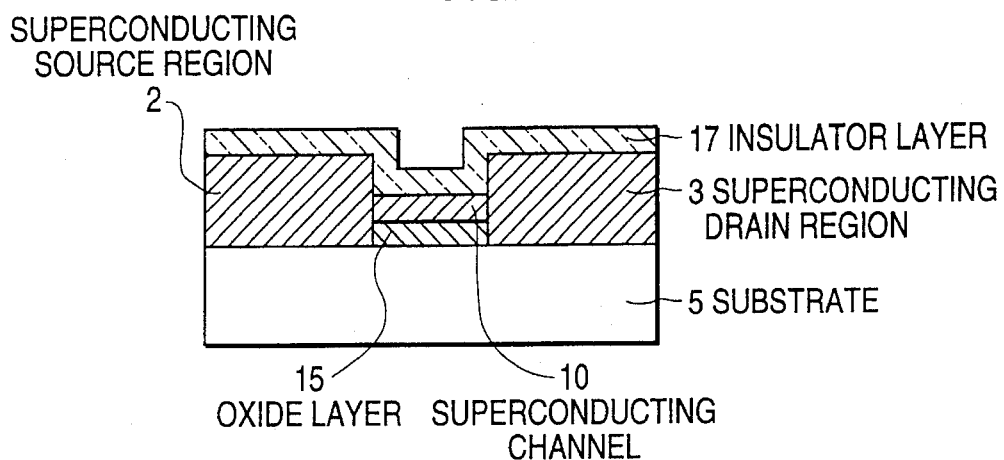
FIGS. 2A to 2C are diagrammatic sectional views for illustrating featured steps of a second embodiment of the process in accordance with the present invention for manufacturing the super-FET.
Figure 2B:
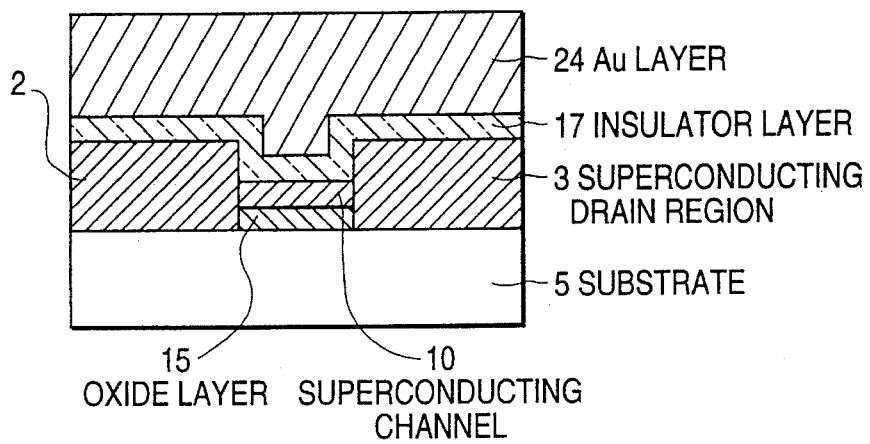
Figure 2C:
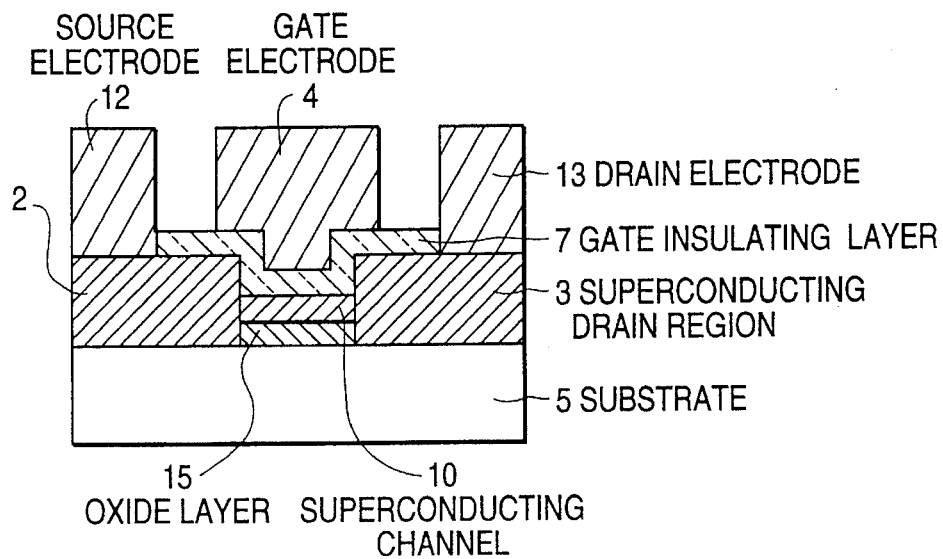

Referring to FIGS. 2A to 2C, a second embodiment of the process for manufacturing the superconducting device will be described.

In this second embodiment, the same processings as those shown in FIGS. 1A to 1E are performed except that the oxide superconductor thin film 11 is an a-axis orientated $Y_1Ba_2Cu_3O_{7-\delta}$ oxide superconductor thin film and the oxide layer 15 has a thickness of 100 nanometers. After the oxide layer 15 of $Pr_1Ba_2Cu_3O_{7-\epsilon}$ and the superconducting channel 10 of $Y_1Ba_2Cu_3O_{7-\delta}$ oxide superconductor are formed, the oxide layers and the oxide superconductor layers deposited on the superconducting source region 2 and the superconducting drain region 3 are removed. A condition of forming the a-axis orientated $Y_1Ba_2Cu_3O_{7-\delta}$ oxide superconductor thin film 11 by off-axis sputtering is as follows:

| Temperature of the substrate | 630° C. |
| Sputtering Gas | Ar: 90% |
|  | O₂: 10% |
| Pressure | 5 × 10⁻² Torr |

Then, as shown in FIG. 2A, an insulator layer 17 of a silicon nitride or MgO is formed by a sputtering successively on the superconducting source region 2, the superconducting channel 10 and the superconducting drain region 3. The insulating layer 17 has a thickness of 10 to 20 nanometers and covers side surfaces of the superconducting source region 2 and the superconducting drain region 3 for their insulation.

As shown in FIG. 2B, an Au layer 24 which will be a gate electrode is formed on the insulator layer 17 by a vacuum evaporation.

Finally, as shown in FIG. 2C, the Au layer 24 is processed into a gate electrode 4, and portions of the insulator layer 17 on the superconducting source region 2 and the superconducting drain region 3 are removed so that a metal source electrode 12 and a metal drain electrode 13 of Au are formed on the superconducting source region 2 and the superconducting drain region 3 respectively. The center portion of the insulator layer 17 under the gate electrode 4 becomes a gate insulating layer 7. With this, the super-FET in accordance with the present invention is completed.

The above mentioned super-FET manufactured in accordance with the second embodiment of the method of the present invention has the superconducting source region 2 and the superconducting drain region 3 formed of a-axis orientated oxide superconductor thin films and the superconducting channel 10 formed of a c-axis orientated oxide superconductor thin film. Therefore, the super-FET has a large current capability. The superconducting channel is formed on the $Pr_1Ba_2Cu_3O_{7-\epsilon}$ non-superconducting oxide layer of which the crystal structure is similar to that of the $Y_1Ba_2Cu_3O_{7-\delta}$ oxide superconductor. Therefore, the bottom portion of the superconducting channel is not degraded so that the substantial cross-sectional area of the superconducting channel of the super-FET is larger than that of a conventional super-FET. Additionally, since the superconducting channel is connected to the superconducting source region and the superconducting drain region at their middle portions, superconducting current efficiently flows into and flows from the superconducting channel. By all of these, the current-voltage characteristic of the super-FET can be improved.

Furthermore, the oxide layer, the superconducting channel, the gate insulating layer and the gate electrode are self-aligned. Therefore, the limitation in the fine processing technique required for manufacturing the super-FET is relaxed.

Embodiment 3

Referring to FIGS. 3A to 3E, a third embodiment of the process for manufacturing the superconducting device will be described.

In this third embodiment, the same processings as those shown in FIGS. 1A and 1B are performed. As shown in FIG.

3A, a center portion of the c-axis orientated $Y_1Ba_2Cu_3O_{7-\delta}$ oxide superconductor thin film 11 is selectively etched by a reactive ion etching process using a chloric gas, an ion milling using Ar-ions or a focused ion beam etching, so that the oxide superconductor of the portion 14 is completely removed and a superconducting source region 2 and a superconducting drain region 3 are formed separately on the substrate 5. The portion 14 is side-etched by an isotropic etching process so as to form a vacancy having a shape of a trapezoid. By the etching, the superconducting source region 2 and the superconducting drain region 3 become shorter at the lower portions and the shortest at the bottom. A surface of the substrate 5 is exposed at the portion 14. The slant side surfaces of the superconducting source region 2 and the superconducting drain region 3 improve efficiency of the superconducting current flow into and from the superconducting channel. The vacancy of the portion 14 prevents a gate electrode which will be formed at the portion 14 from contacting the superconducting source region 2 and the superconducting drain region 3, too.

Figure 3A:
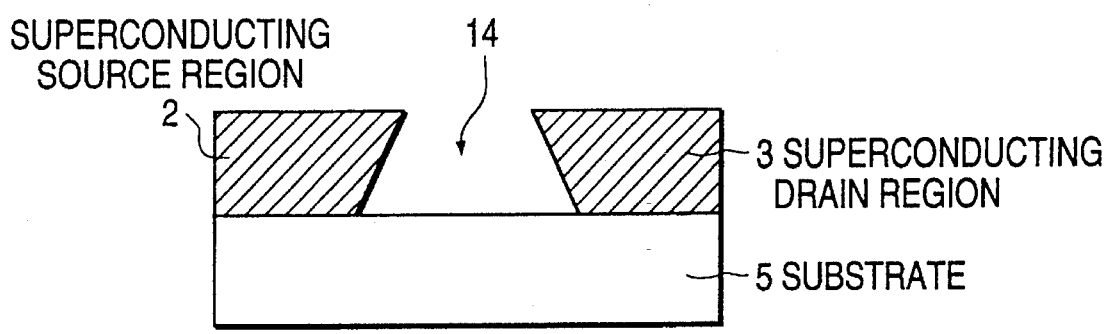
FIGS. 3A to 3E are diagrammatic sectional views for illustrating featured steps of a third embodiment of the process in accordance with the present invention for manufacturing the super-FET.
Figure 3B:
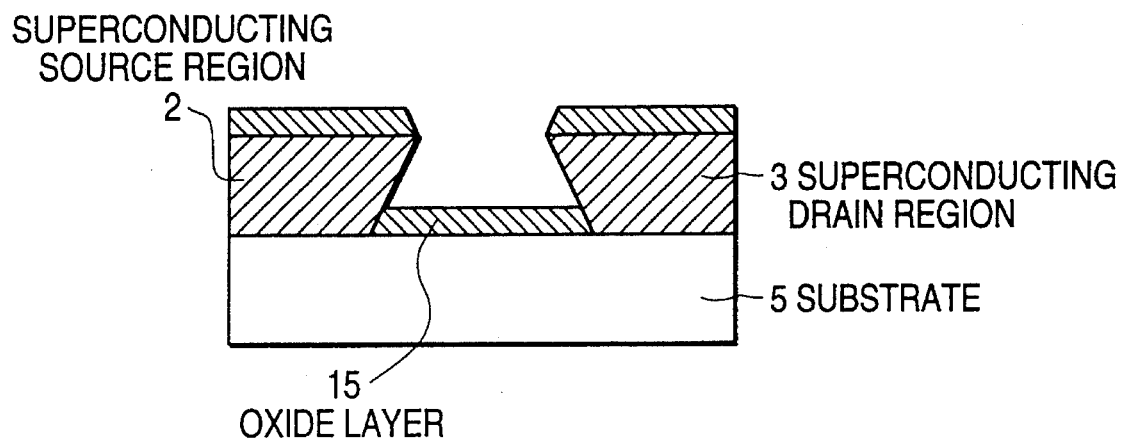

Thereafter, the substrate is 5 heated to a temperature of 350° to 400° C. under a pressure lower than $1\times10^{-9}$ torr so as to clean the exposed surface portion 14 of the substrate 5. As shown in FIG. 3B, an oxide layer 15 composed of c-axis orientated $Pr_1Ba_2Cu_3O_{7-\epsilon}$ thin film having a thickness of 150 nanometers is deposited on the exposed surface 14 of the substrate 5, by a sputtering. The oxide layer 15 preferably has a thickness ranging from one third to the same thickness of the superconducting source region 2 and the superconducting drain region 3. A condition of forming the c-axis orientated $Pr_1Ba_2Cu_3O_{7-\epsilon}$ oxide thin film 15 by a sputtering is follows:

| | |
|---|---|
| Temperature of the substrate | 700° C. |
| Sputtering Gas | Ar: 90% |
| | $O_2$: 10% |
| Pressure | $5 \times 10^{-2}$ Torr |

Figure 3C:
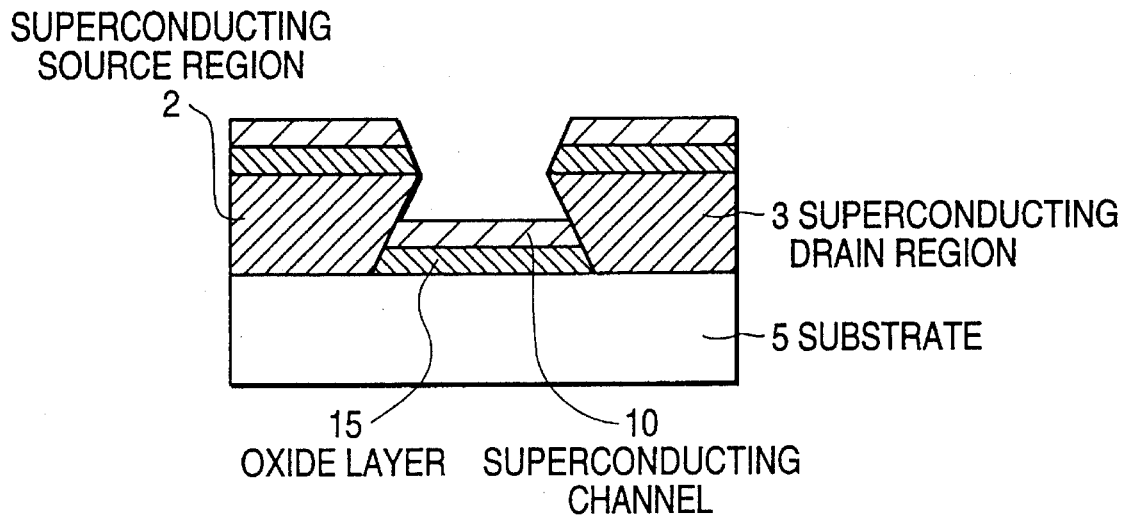

Then, a superconducting channel 10 of a c-axis orientated $Y_1Ba_2Cu_3O_{7-\delta}$ oxide superconductor thin film having a thickness of about 5 nanometer is continuously formed by a sputtering on the oxide layer 15 of $Pr_1Ba_2Cu_3O_{7-\epsilon}$ thin film, as shown in FIG. 3C. A condition of forming the c-axis orientated $Y_1Ba_2Cu_3O_{7-\delta}$ oxide superconductor thin film is the same as that of the $Pr_1Ba_2Cu_3O_{7-\epsilon}$ thin film. The $Pr_1Ba_2Cu_3O_{7-\delta}$ oxide thin film and $Y_1Ba_2Cu_3O_{7-\delta}$ oxide super conductor thin film deposited on the superconducting source region 2 and the superconducting drain region 3 can be removed, if necessary.

Figure 3D:
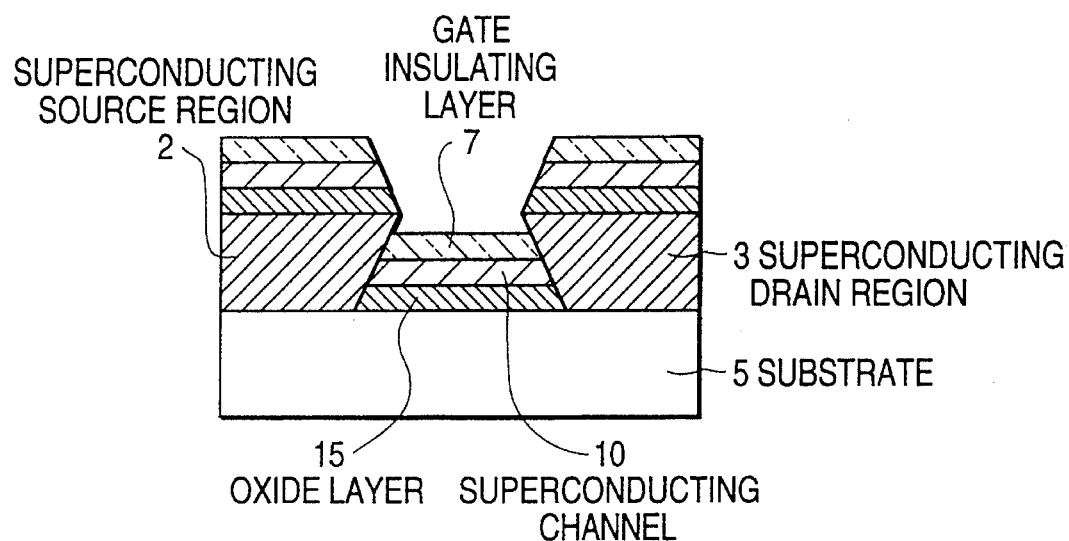

Thereafter, as shown in FIG. 3D, a gate insulating layer 7 of MgO is formed by a sputtering or a CVD on the superconducting channel 10. The gate insulating layer 7 has a thickness of 10 to 20 nanometers.

Figure 3E:
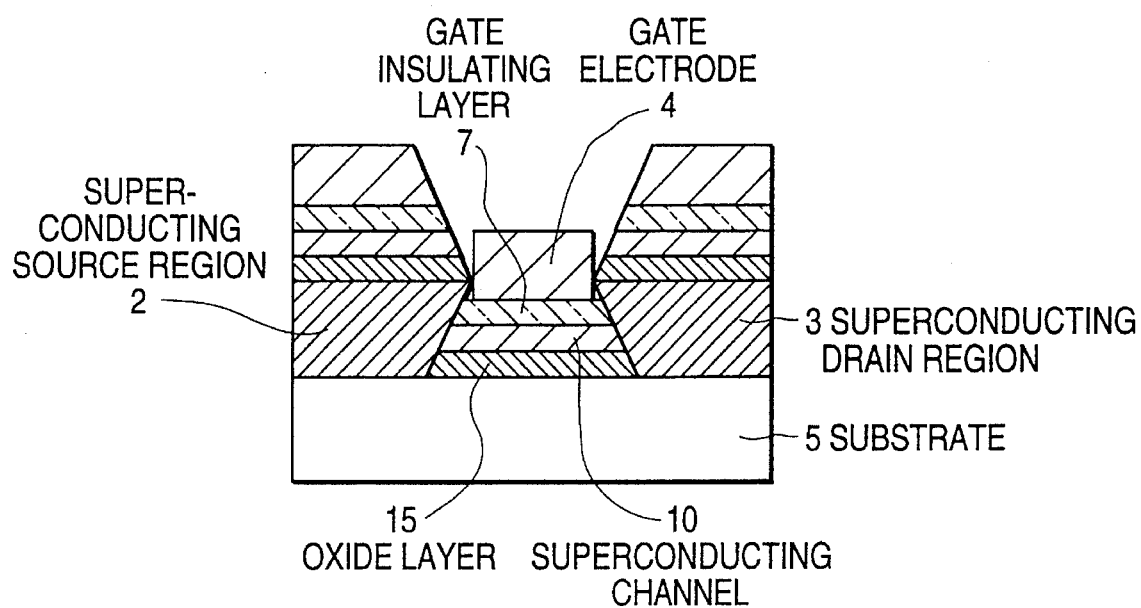

Finally, as shown in FIG. 3E, a gate electrode 4 of Au is formed on a center portion of the gate insulating layer 7 by a vacuum evaporation apart from the superconducting source region 2 and the superconducting drain region 3. A metal source electrode and a metal drain electrode may be formed on the superconducting source region 2 and the superconducting drain region 3 respectively, if necessary. With this, the super-FET in accordance with the present invention is completed.

The above mentioned super-FET manufactured in accordance with the third embodiment of the method of the present invention has a superconducting channel which is formed on the $Pr_1Ba_2Cu_3O_{7-\epsilon}$ non-superconducting oxide layer of which the crystal structure is similar to that of the $Y_1Ba_2Cu_3O_{7-\delta}$ oxide superconductor. Therefore, the bottom portion of the superconducting channel is not degraded so that the substantial cross-sectional area of the superconducting channel of the super-FET is larger than that of a conventional super-FET. Additionally, since the superconducting source region and the superconducting drain region have slant side surfaces and the superconducting channel is connected to the superconducting source region and the superconducting drain region at middle portions of the slant surfaces, superconducting current efficiently flows into and flows from the superconducting channel. By these, the current capability of the super-FET can be improved. In the above mentioned process, the super-FET can be manufactured only by sputtering and CVD which are simpler than MBE.

Furthermore, the oxide layer, the superconducting channel, the gate insulating layer and the gate electrode are self-aligned. Therefore, the limitation in the fine processing technique required for manufacturing the super-FET is relaxed.

Embodiment 4

Figure 4A:
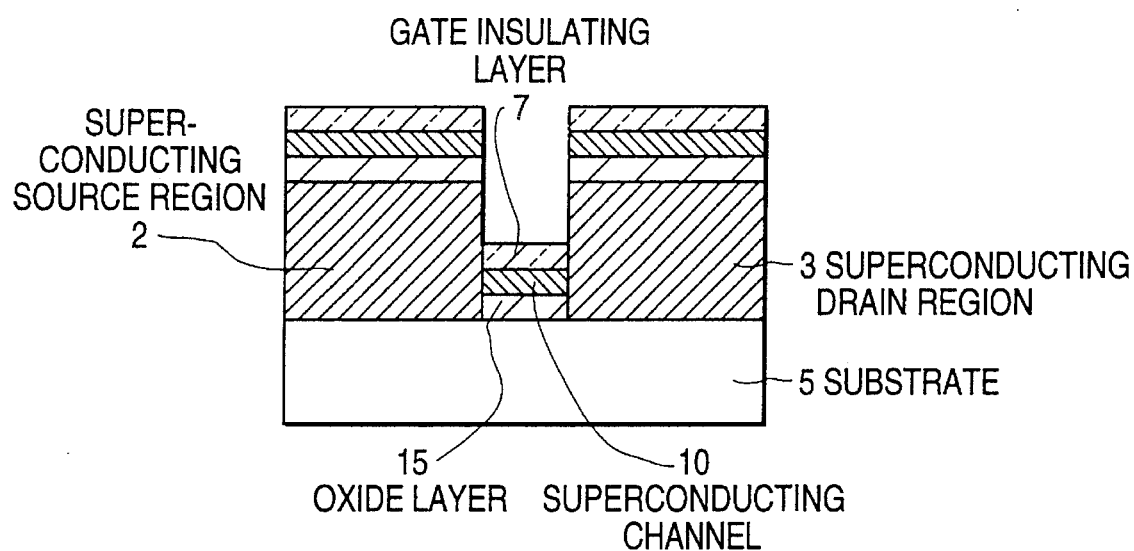
FIGS. 4A to 4C are diagrammatic sectional views for illustrating featured steps of a fourth embodiment of the process in accordance with the present invention for manufacturing the super-FET.
Figure 4B:
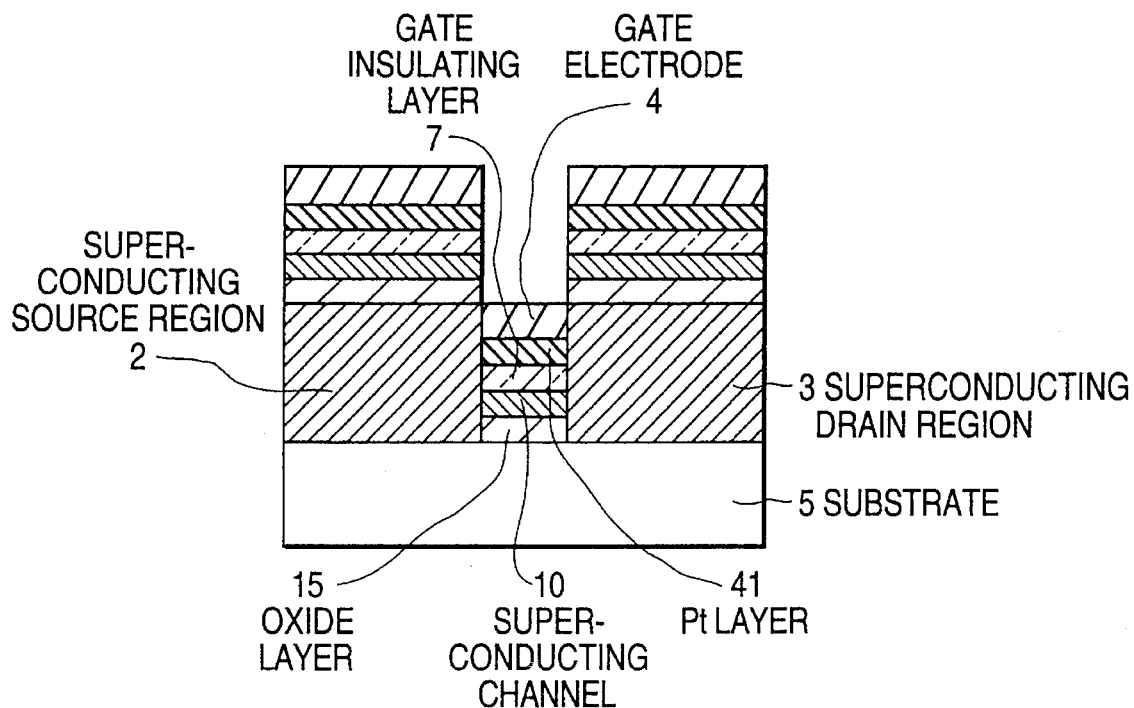
Figure 4C:
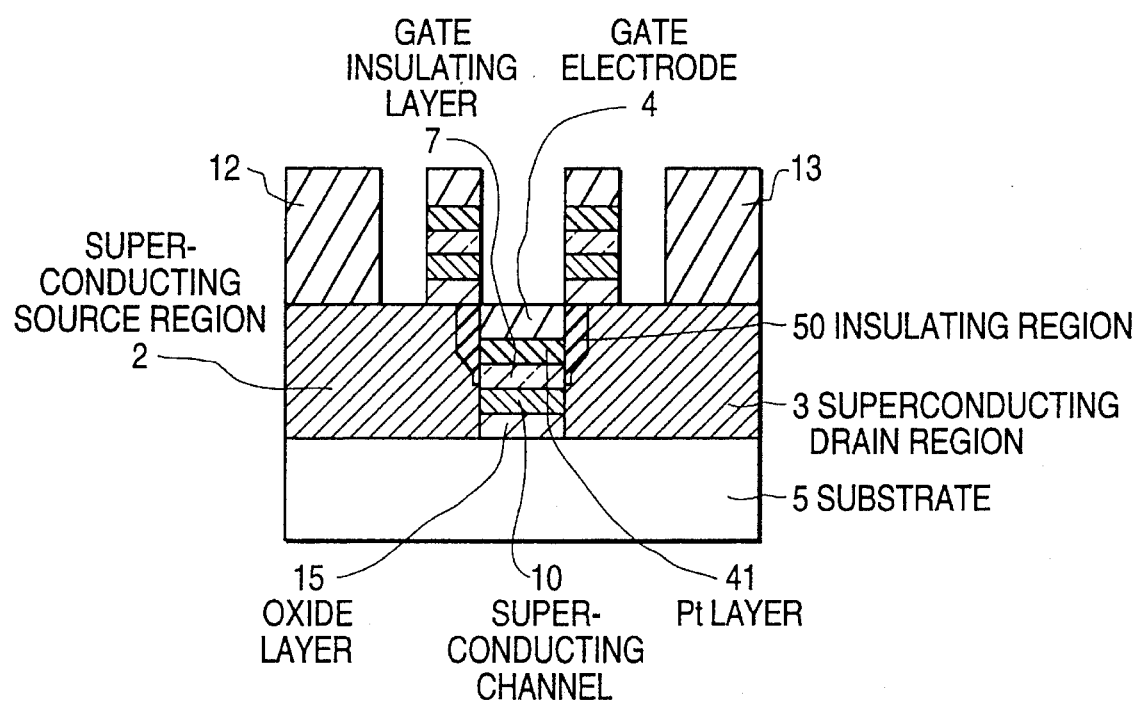

Referring to FIGS. 4A to 4C, a forth embodiment of the process for manufacturing the superconducting device will be described.

In this fourth embodiment, the same processings as those shown in FIGS. 1A to 1E are performed except that the oxide superconductor thin film 11 is an a-axis orientated $Y_1Ba_2Cu_3O_{7-\delta}$ oxide superconductor thin film and the oxide layer 15 has a thickness of 100 nanometers. After the oxide layer 15 of $Pr_1Ba_2Cu_3O_{7-\epsilon}$ and the superconducting channel 10 of $Y_1Ba_2Cu_3O_{7-\delta}$ oxide superconductor are formed, the oxide layers and the oxide superconductor layers deposited on the superconducting source region 2 and the superconducting drain region 3 are removed, if necessary.

Then, as shown in FIG. 4A, a gate insulating layer 7 of a silicon nitride or MgO is formed by a sputtering on the superconducting channel 10. The gate insulating layer 7 has a thickness of 10 to 20 nanometers.

As shown in FIG. 4B, a Pt layer 41 is formed on the gate insulating layer 7 by a vacuum evaporation and a gate electrode 4 is formed of polycrystalline silicon on the Pt layer 41.

Finally, the substrate 5 is heated to a temperature of 800° C. so that silicon is diffused into the superconducting source region and the superconducting drain region so as to form a insulating region 50, as shown in FIG. 4C. The Pt layer 41 prevents silicon from diffusing into the superconducting channel 10. Portions of the stacked layers on the superconducting source region 2 and the superconducting drain region 3 are removed so that a metal source electrode 12 and a metal drain electrode 13 of Au are formed on the superconducting source region 2 and the superconducting drain region 3 respectively. With this, the super-FET in accordance with the present invention is completed.

The above mentioned super-FET manufactured in accordance with the fourth embodiment of the method of the present invention has the superconducting channel which is formed on the $Pr_1Ba_2Cu_3O_{7-\epsilon}$ non-superconducting oxide layer of which the crystal structure is similar to that of the $Y_1Ba_2Cu_3O_{7-\delta}$ oxide superconductor. Therefore, the bottom portion of the superconducting channel is not degraded so that the substantial cross-sectional area of the superconducting channel of the super-FET is larger than that of a conventional super-FET. Additionally, since the superconducting channel is connected to the superconducting source region and the superconducting drain region at their middle portions, superconducting current efficiently flows into and flows from the superconducting channel. By all of these, the current-voltage characteristic of the super-FET can be improved. In the above mentioned process, the non-superconducting oxide layer 15, the superconducting channel 10, the gate insulating layer 7 and the gate electrode 4 are self-aligned and the insulating region 50 which isolates the gate electrode 4 from the superconducting source region 2 and the superconducting drain region 3 is also made self-align manner.

Therefore, the limitation in the fine processing technique required for manufacturing the super-FET is relaxed.

Embodiment 5

Referring to FIGS. 5A to 5D, a fifth embodiment of the process for manufacturing the superconducting device will be described.

Figure 5A:
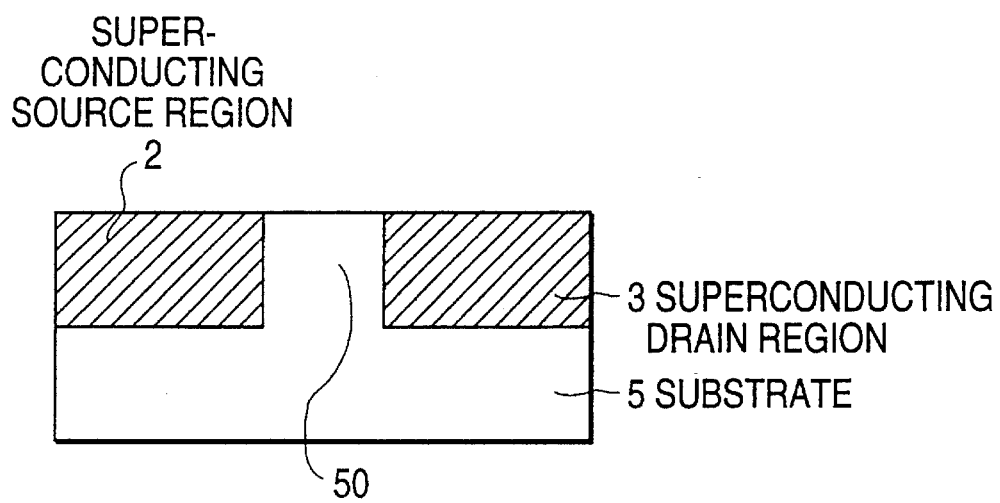
FIGS. 5A to 5D are diagrammatic sectional views for illustrating featured steps of a fifth embodiment of the process in accordance with the present invention for manufacturing the super-FET.

In this fifth embodiment, the same processings as those shown in FIGS. 1A to 1C are performed. As shown in FIG. 5A, an insulating region 50 of MgO, SrTiO$_3$, Pr$_1$Ba$_2$Cu$_3$O$_{7-\epsilon}$ is formed between the superconducting source region 2 and the superconducting drain region 3 so as to have almost the same thickness as those of the superconducting source region 2 and the superconducting drain region 3. In other words, upper surface of the insulating region 50 is the same level as those of he superconducting source region 2 and the superconducting drain region 3, and the upper surfaces are successive and planar. In this connection, in order to planarize the upper surfaces of the insulating region 50, the superconducting source region 2 and the superconducting drain region 3, the insulating region 50 is formed by a CVD and then needless portion of the formed insulating region is removed by a lift-off process or a focused ion beam etching process. The upper surfaces of the insulating region 50, the superconducting source region 2 and the superconducting drain region 3 may be etched back, if necessary.

Figure 5B:
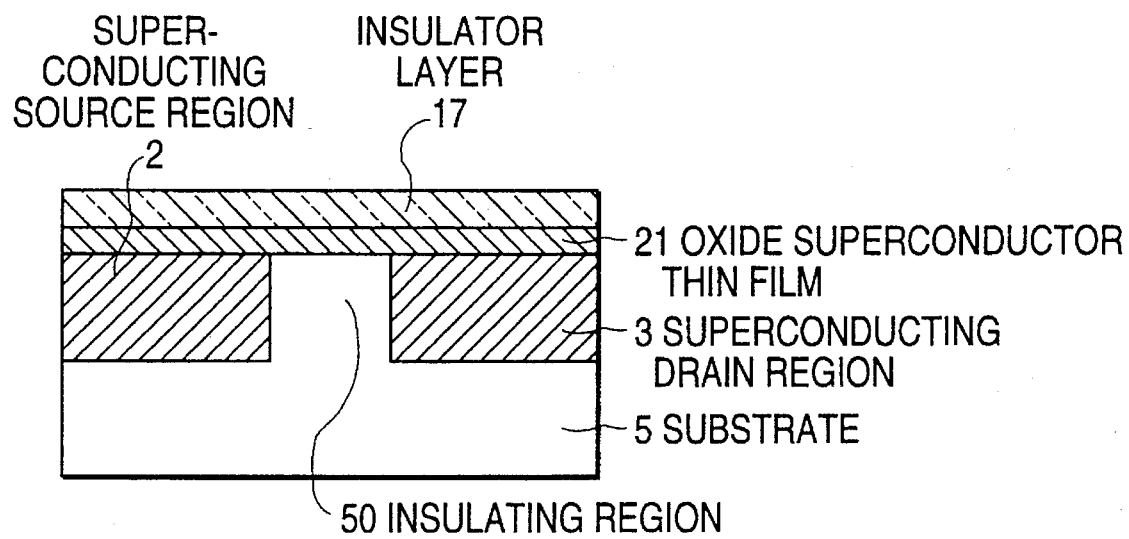

Thereafter, as shown in FIG. 5B, a Y$_1$Ba$_2$Cu$_3$O$_{7-\delta}$ oxide superconductor thin film 21 having a thickness of 5 nanometers and a insulator layer 17 having a thickness of about 10 nanometers of MgO or silicon nitride are formed by successive sputtering processes. The portion of the Y$_1$Ba$_2$Cu$_3$O$_{7-\delta}$ oxide superconductor thin film 21 on the insulating region 50 will be a superconducting channel, when the super-FET will be completed.

Figure 5C:
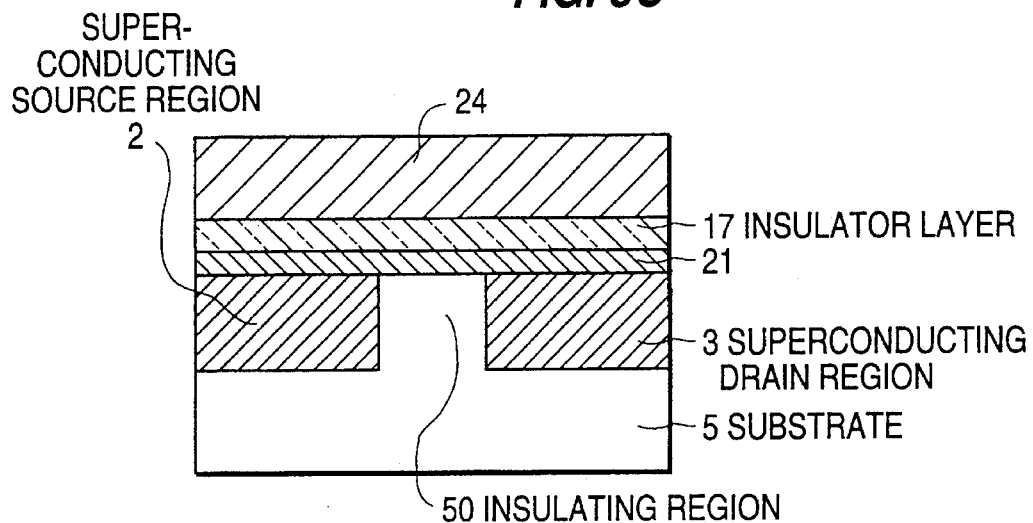
Figure 5D:
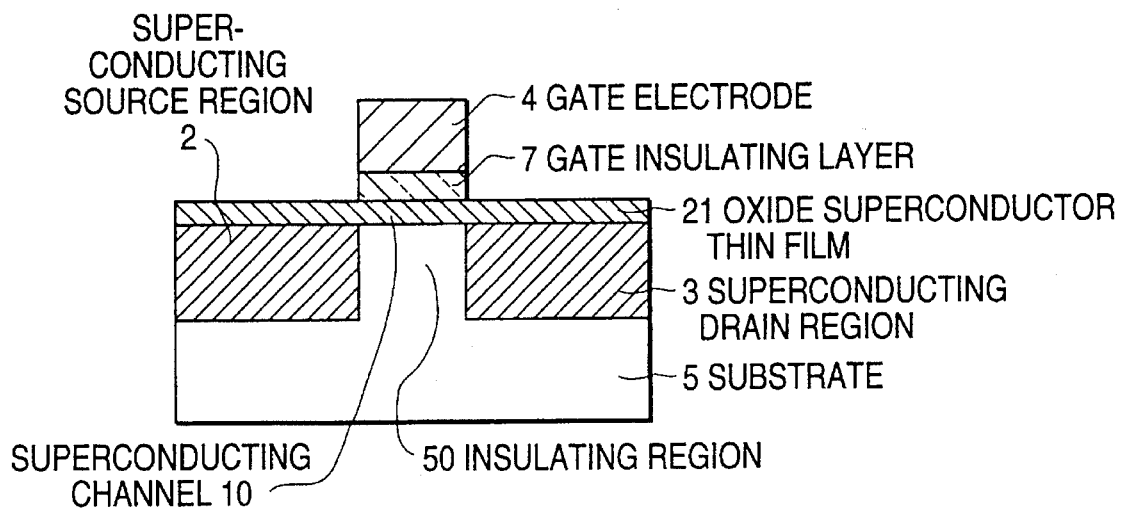

Then, as shown in FIG. 5C, an Au layer 24 is formed on the insulator layer 17 by a vacuum evaporation. Finally, the Au layer 24 is processed into a gate electrode 4 and the insulator layer 17 is processed into a gate insulating layer 7, which are arranged on the insulating region 50, as shown in FIG. 5D. A portion of the Y$_1$Ba$_2$Cu$_3$O$_{7-\delta}$ oxide superconductor thin film 21 under the gate insulating layer 7 becomes a superconducting channel 10. A metal source electrode and a metal drain electrode may be formed on the superconducting source region 2 and the superconducting drain region 3 respectively, if necessary. With this, the super-FET in accordance with the present invention is completed.

The above mentioned super-FET manufactured in accordance with the fifth embodiment of the method of the present invention has a superconducting channel which is formed of the oxide superconductor thin film deposited on the planar surfaces of the insulating region 50, the superconducting source region 2 and the superconducting drain region 3.

Therefore, the superconducting channel 10 is free from a stress so as to have good properties. Additionally, since the position and the length of the superconducting channel 10 are determined by the insulating region 50, the dimensions of the superconducting device, especially the length of the superconducting channel 10 can be accurately determined. Furthermore, since the superconducting channel 10 is connected to the top portions of the superconducting source region 2 and the superconducting drain region 3, superconducting current does not spreads in the superconducting source region 2 and the superconducting drain region 3. Therefore, the superconducting current flows into and flow from the superconducting channel, efficiently.

In the above mentioned embodiments, the oxide superconductor thin film can be formed of not only the Y—Ba—Cu—O compound oxide superconductor material, but also a high-T$_c$ (high critical temperature) oxide superconductor material, particularly a high-T$_c$ copper-oxide type compound oxide superconductor material, for example a Bi—Sr—Ca—Cu—O compound oxide superconductor material, and a Tl—Ba—Ca—Cu—O compound oxide superconductor material.

The invention has thus been shown and described with reference to the specific embodiments. However, it should be noted that the present invention is in no way limited to the details of the illustrated structures but converts and modifications may be made within the scope of the appended claims.

We claim:

1. A method for manufacturing a three-terminal superconducting device, comprising the steps of:

forming on a principal surface of a substrate a first oxide superconductor thin film;

selectively etching a center portion of the first oxide superconductor thin film so that the portion of the first oxide superconductor thin film is completely removed and a surface of the substrate is exposed so as to form a superconducting source region and a superconducting drain region separately on the substrate;

forming a non-superconductor layer having a thickness ranging from one third thickness to the same thickness of the superconducting source region and the superconducting region on the exposed surface of the substrate;

forming a second extremely thin oxide superconductor thin film on the non-superconductor layer so that an extremely thin superconducting channel which is connected to the superconducting source region and the superconducting drain region at the higher portions than their one third height portions is formed on the non-superconductor layer; and forming a gate insulating layer and a gate electrode stacked on the gate insulating layer on a portion of the second oxide superconductor thin film above the non-superconductor layer.

2. A method as claimed in claim 1, wherein the non-superconductor layer is formed so as to have a thickness which is approximately half that of the first oxide superconductor thin film so that the superconducting channel, the gate insulating layer and the gate electrode are self aligned.

3. A method as claimed in claim 2, wherein the gate insulating layer is formed so as to cover the side surfaces of the superconducting source region and the superconducting drain region.

4. A method as claimed in claim 1, wherein the non-superconductor layer is formed so as to have almost the same thickness as those of the superconducting region and the superconducting drain region.

5. A method as claimed in claim 1, wherein the first oxide superconductor thin film is etched by an isotropic etching process so as to form a vacancy having a shape of a trapezoid between the superconducting source region and the superconducting drain region, widths of the superconducting source region and the superconducting drain region being narrower at the lower portions and narrowest at the bottom.

6. A method as claimed in claim 1, wherein the method further includes the step of heating the substrate to a temperature of 350° to 400° C. under a pressure lower than $1 \times 10^{-9}$ Torr after etching the first oxide superconductor thin film in order to clean the exposed surface of the substrate.

7. A method as claimed in claim 1, wherein the gate electrode is formed of a material which includes silicon.

8. A method as claimed in claim 7, wherein the gate electrode is formed of polycrystalline silicon.

9. A method as claimed in claim 7, wherein the method further comprises the step of heating the substrate so that silicon diffuses from the gate electrode into the superconducting source region and the superconducting drain region so as to form an insulating region isolating the gate electrode from the superconducting source region and the superconducting drain region.

10. A method as claimed in claim 9, wherein the method further comprises the step of forming a metal layer on the gate insulating layer which prevents silicon from diffusing into the superconducting channel.

11. A method as claimed in claim 1, wherein the non-superconductor layer is formed of an oxide having a crystal structure which is similar to that of the oxide superconductor.

12. A method as claimed in claim 11, wherein the non-superconductor layer is formed of $Pr_1Ba_2Cu_3O_{7-\epsilon}$.

13. A method as claimed in claim 1, wherein the method further comprises the step of forming a metal source electrode on the superconducting source region and a metal drain electrode on the superconducting drain region.

14. A method as claimed in claim 1, wherein the oxide superconductor is formed of high-$T_c$ (high critical temperature) oxide superconductor.

15. A method as claimed in claim 14, wherein the oxide superconductor is formed of an oxide superconductor material selected from the group consisting of a Y—Ba—Cu—O compound oxide superconductor material, a Bi—Sr—Ca—Cu—O compound oxide superconductor material, and a T1—Ba—Ca—Cu—O type compound oxide superconductor material.

16. A method as claimed in claim 1, wherein the substrate is formed of a material selected from the group consisting of a MgO (100) substrate, a SrTiO$_3$ (100) substrate and a CdNdAlO$_4$ (001) substrate.

17. The method as claimed in claim 1, wherein a thickness of the extremely thin oxide superconductor thin film is less than or equal to 5 nanometers.

18. The method as claimed in claim 14, wherein the high-$T_c$ oxide superconductor is a high-$T_c$ copper-oxide compound oxide superconductor.

* * * * *